US010213017B2

(12) United States Patent
Chen et al.

(10) Patent No.: US 10,213,017 B2
(45) Date of Patent: Feb. 26, 2019

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 26 days.

(21) Appl. No.: 15/475,138

(22) Filed: Mar. 31, 2017

(65) Prior Publication Data

US 2018/0092462 A1  Apr. 5, 2018

(30) Foreign Application Priority Data

Oct. 5, 2016  (TW) .............................. 105132507 A
Oct. 5, 2016  (TW) .............................. 105132508 A

(51) Int. Cl.
```
A47B 88/447    (2017.01)
A47B 88/43     (2017.01)
A47B 88/493    (2017.01)
F16C 29/04     (2006.01)
F16C 29/12     (2006.01)
```
(Continued)

(52) U.S. Cl.
CPC ............ *A47B 88/447* (2017.01); *A47B 88/43* (2017.01); *A47B 88/493* (2017.01); *F16C 29/04* (2013.01); *F16C 29/12* (2013.01); *H05K 7/1489* (2013.01); *H05K 7/183* (2013.01)

(58) Field of Classification Search
CPC ..... A47B 88/447; A47B 88/43; A47B 88/493; F16C 29/04; F16C 29/12; H05K 7/183
See application file for complete search history.

(56) References Cited

U.S. PATENT DOCUMENTS 6,367,899 B1 * 4/2002 Hwang ................ A47B 88/493
                                                    312/334.44
6,851,774 B2 * 2/2005 Chen .................... A47B 88/487
                                                    312/334.44
(Continued)

FOREIGN PATENT DOCUMENTS

| EP | 2 989 930 A1 | 3/2016 |
| JP | 3079443 U | 8/2001 |
| JP | 3098133 U | 2/2004 |

*Primary Examiner* — Hanh V Tran
(74) *Attorney, Agent, or Firm* — Winston Hsu

(57) ABSTRACT

A slide rail assembly comprises a first rail, a second rail, a third rail and an engaging member. The first rail comprises a releasing feature. The second rail is movable relative to the first rail. The third rail is movable relative to the second rail. The engaging member is pivoted to the second rail. Wherein, the engaging member is configured to engage with the third rail to allow the second rail and the third rail to be synchronously moved relative to the first rail along a first direction, and the releasing feature is configured to disengage the engaging member from the third rail when the second rail is synchronously moved with the third rail relative to the first rail to a predetermined position.

30 Claims, 15 Drawing Sheets

(51) Int. Cl.
*H05K 7/18* (2006.01)
*H05K 7/14* (2006.01)

(56) References Cited

U.S. PATENT DOCUMENTS

| | | | |
|---|---|---|---|
| 6,935,710 B2 * | 8/2005 | Chen .................... | A47B 88/487 |
| | | | 312/333 |
| 6,938,967 B2 | 9/2005 | Dubon | |
| 7,029,080 B2 * | 4/2006 | Barry, Jr. ............ | H05K 7/1489 |
| | | | 312/333 |
| 7,708,359 B2 * | 5/2010 | Peng .................... | A47B 88/57 |
| | | | 312/334.44 |
| 7,780,252 B2 * | 8/2010 | Mushan ............... | A47B 88/493 |
| | | | 312/333 |
| 8,240,789 B2 | 8/2012 | Chen | |
| 8,622,492 B2 | 1/2014 | Chen | |
| 9,681,749 B2 * | 6/2017 | Chen .................... | A47B 88/49 |
| 9,980,566 B2 * | 5/2018 | Chen .................... | A47B 88/44 |
| 2002/0089274 A1 | 7/2002 | Liang | |
| 2005/0017614 A1 | 1/2005 | Cirocco | |
| 2006/0029304 A1 | 2/2006 | Chen | |
| 2007/0164644 A1 * | 7/2007 | Hwang ................. | A47B 88/49 |
| | | | 312/333 |
| 2009/0096340 A1 * | 4/2009 | Chen .................... | A47B 88/493 |
| | | | 312/334.46 |
| 2009/0195133 A1 * | 8/2009 | Chang ................. | A47B 88/493 |
| | | | 312/334.46 |
| 2010/0259146 A1 * | 10/2010 | Chen .................... | A47B 88/493 |
| | | | 312/319.1 |
| 2012/0106880 A1 * | 5/2012 | Chen .................... | H05K 7/1489 |
| | | | 384/49 |
| 2013/0259410 A1 | 10/2013 | Judge | |
| 2013/0259411 A1 * | 10/2013 | Judge .................. | F16C 29/04 |
| | | | 384/49 |
| 2014/0327352 A1 * | 11/2014 | Chen .................... | E05D 15/0686 |
| | | | 312/334.46 |
| 2017/0208942 A1 * | 7/2017 | Chen .................... | A47B 88/044 |

* cited by examiner

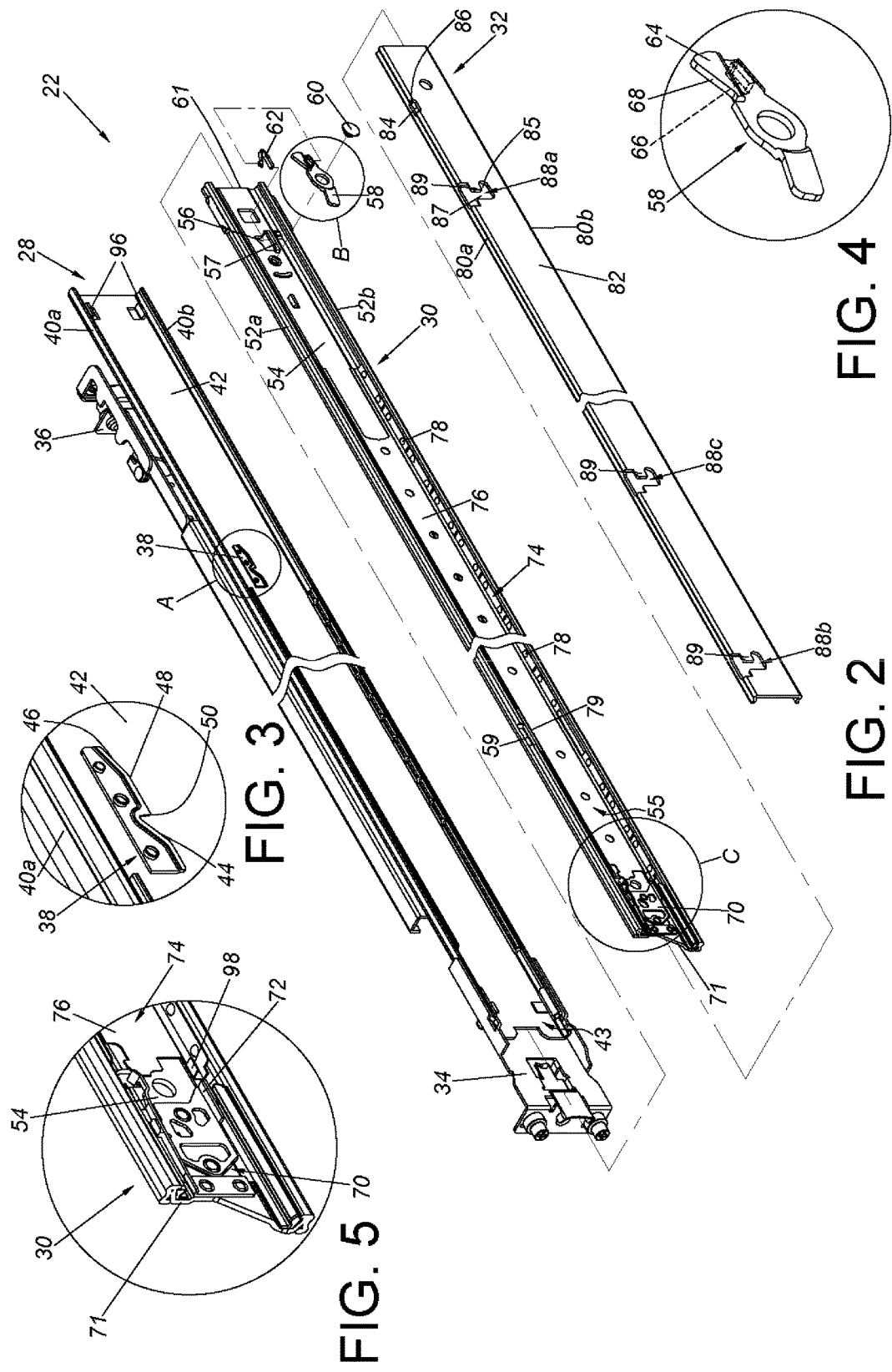

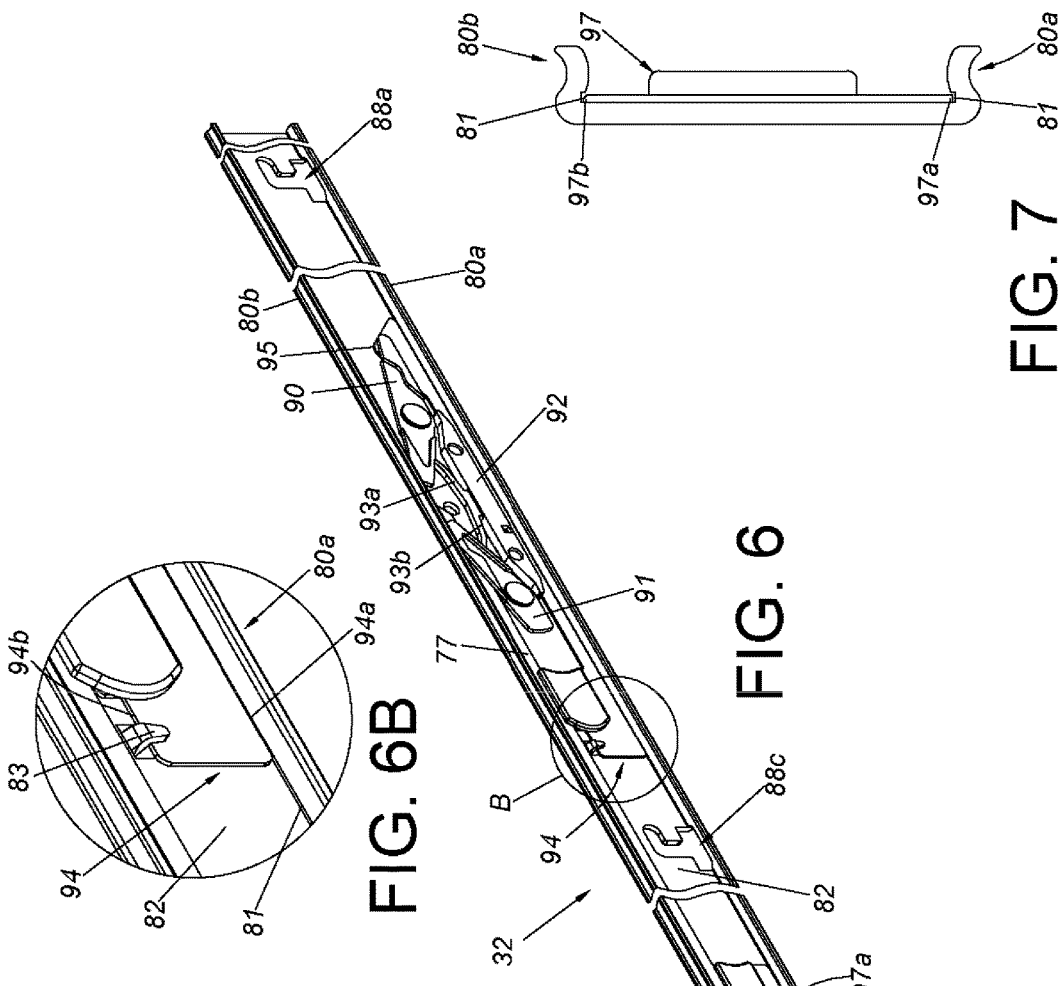

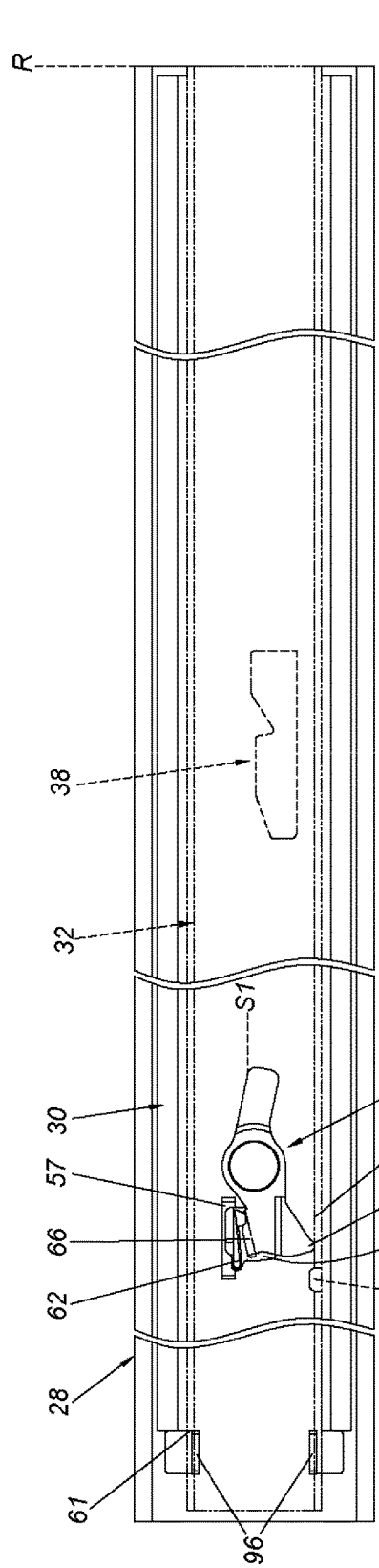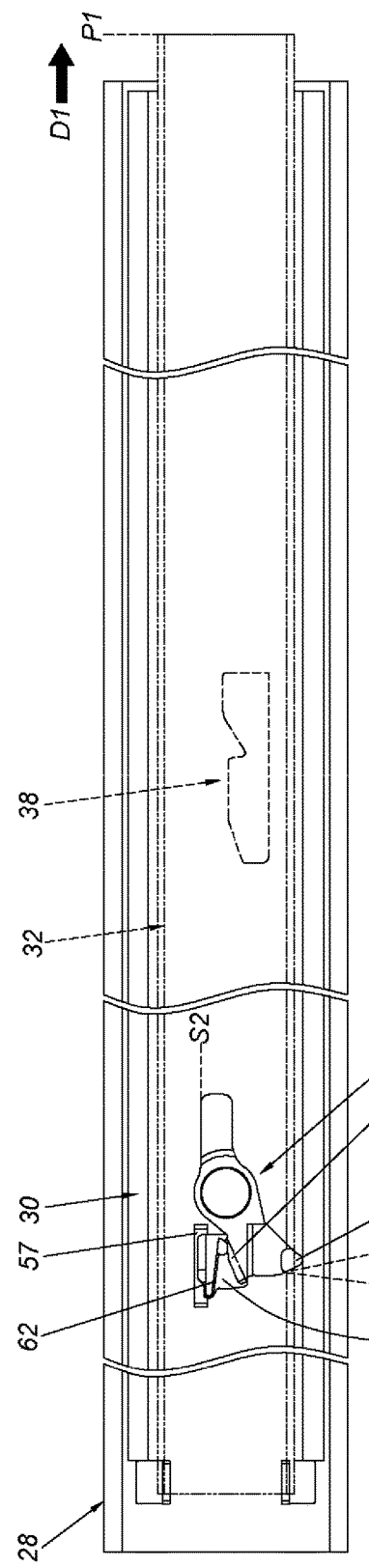

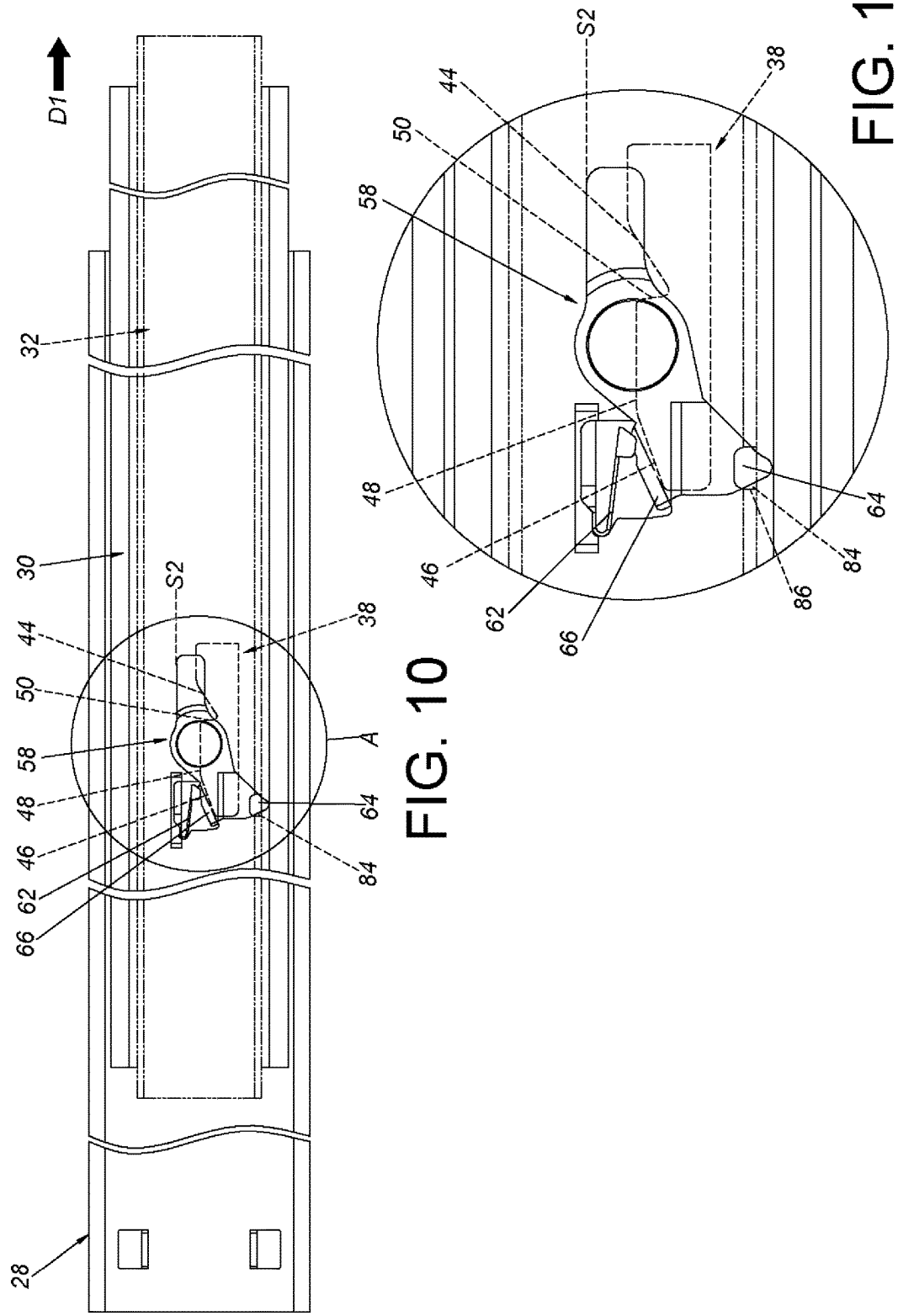

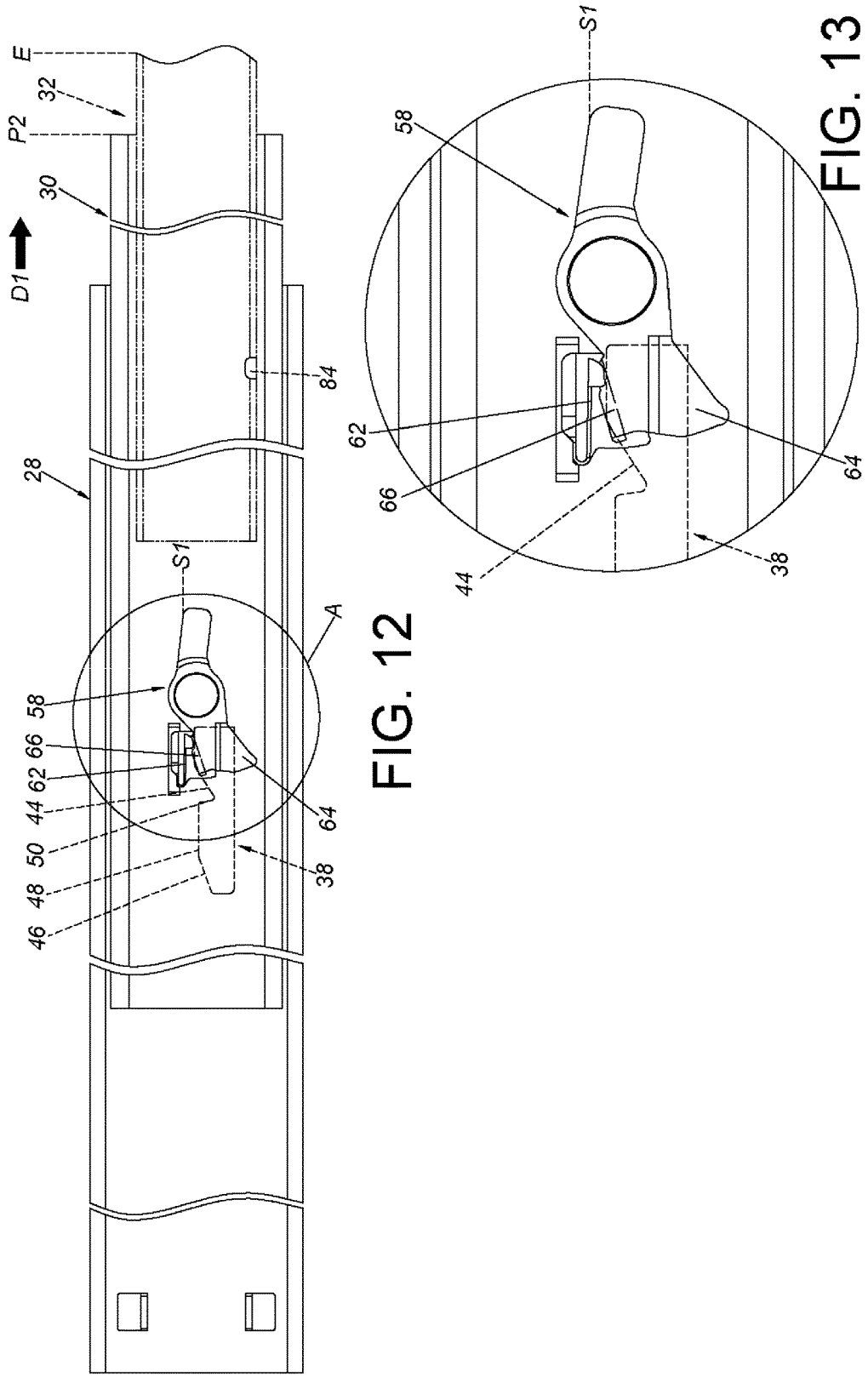

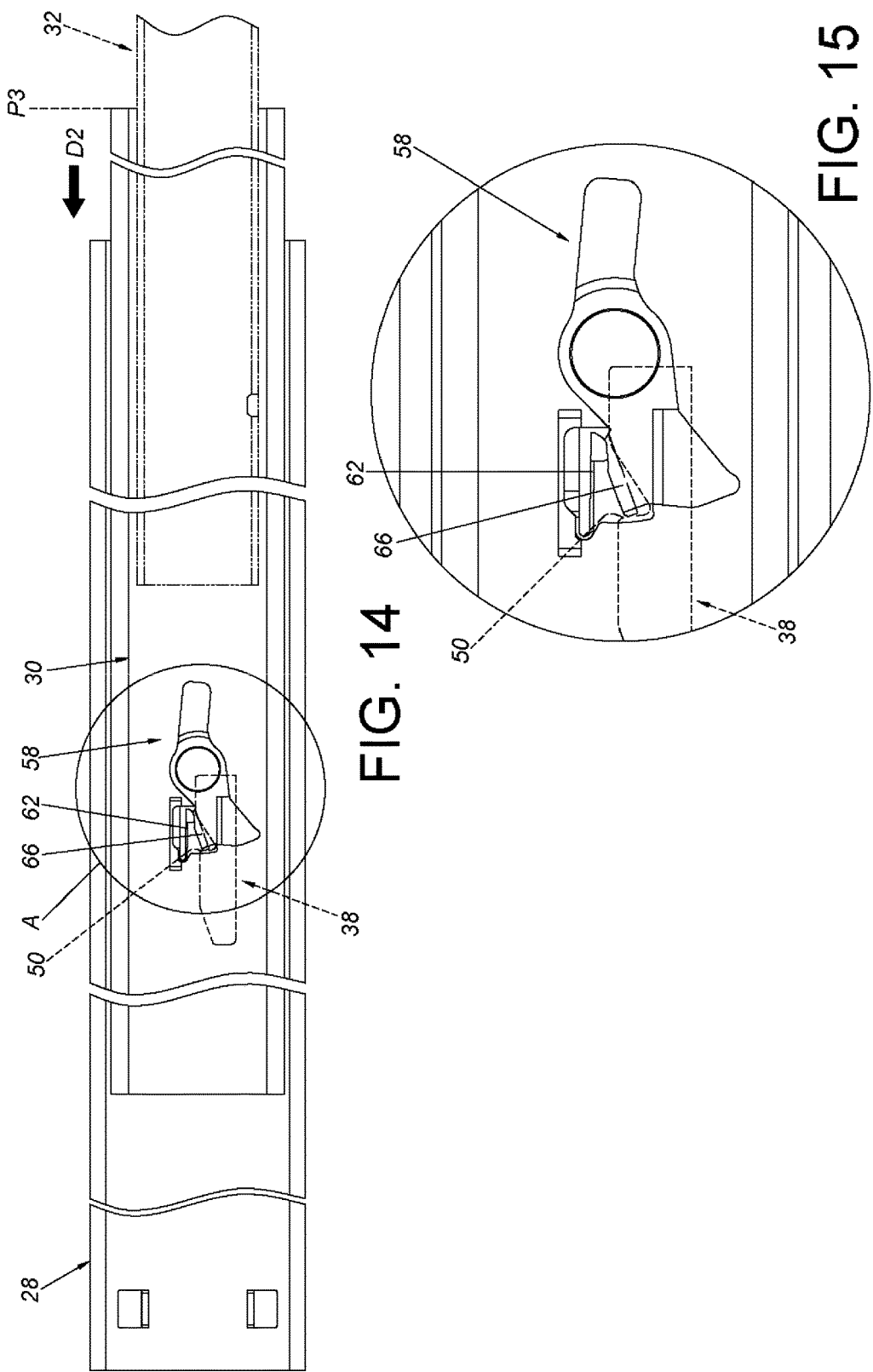

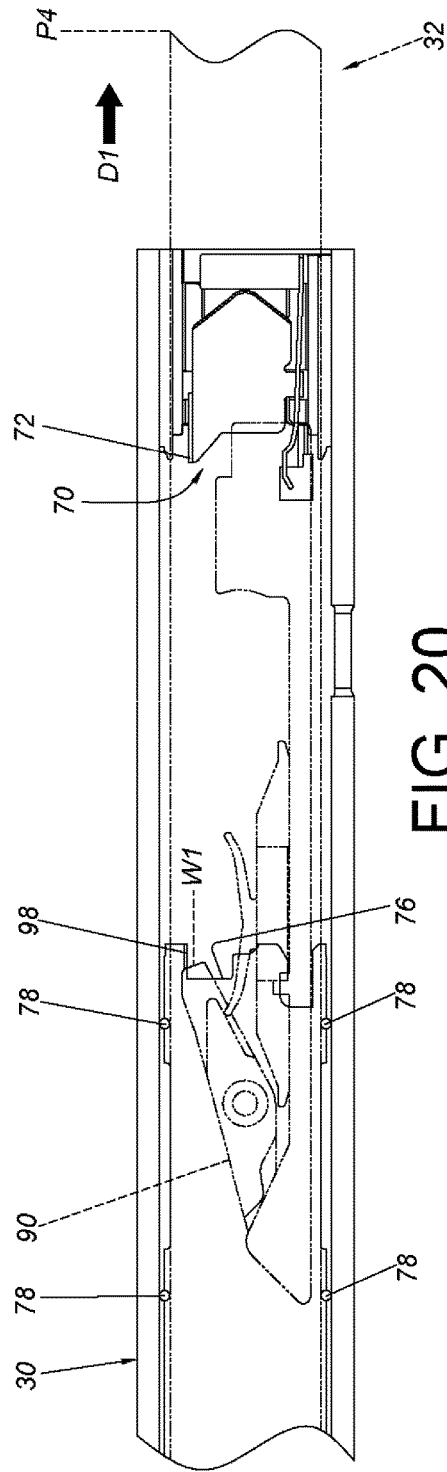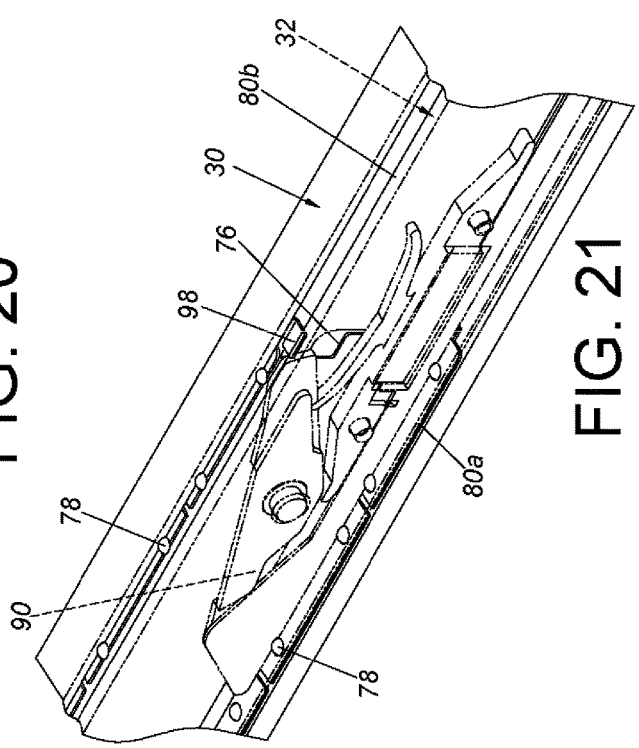
FIG. 20
FIG. 21

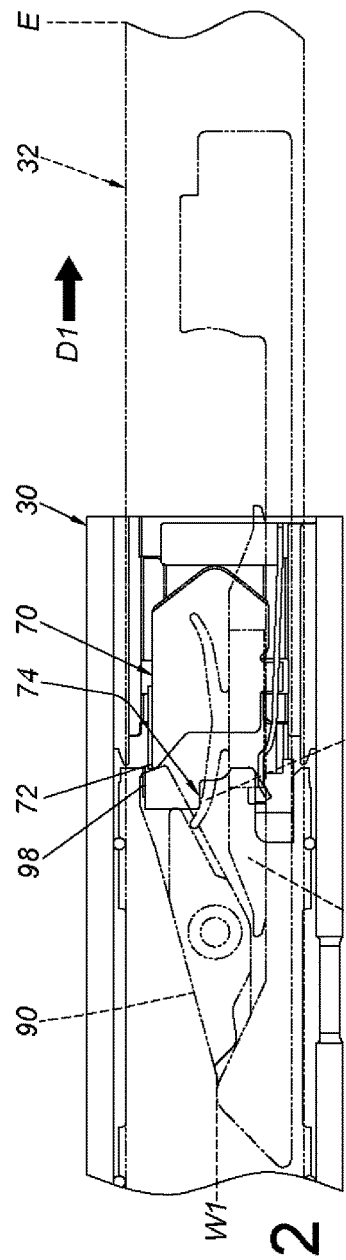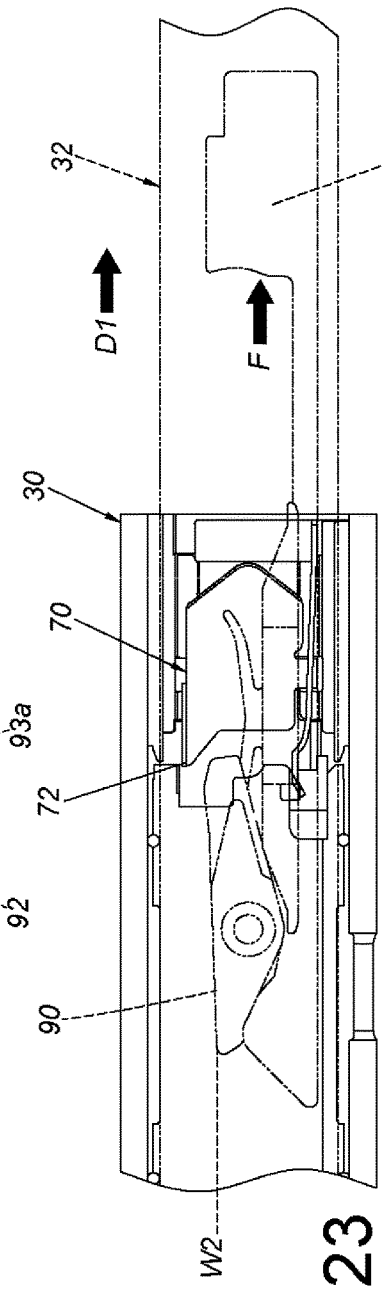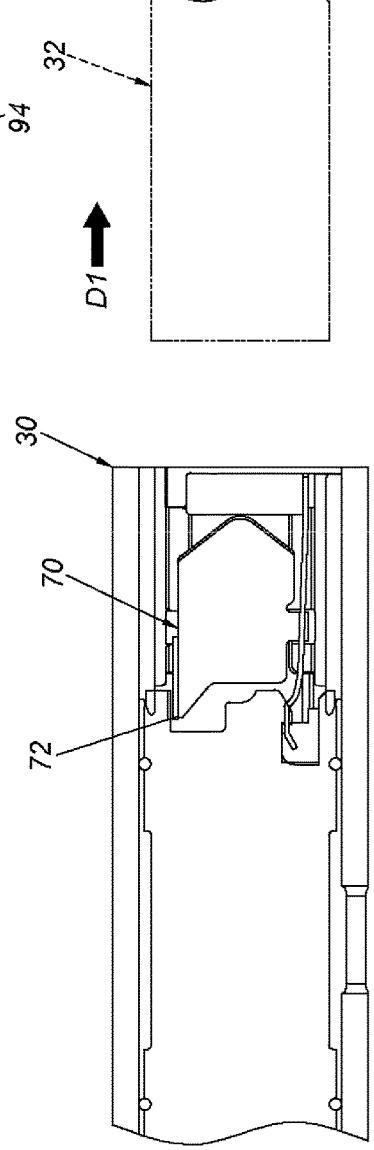

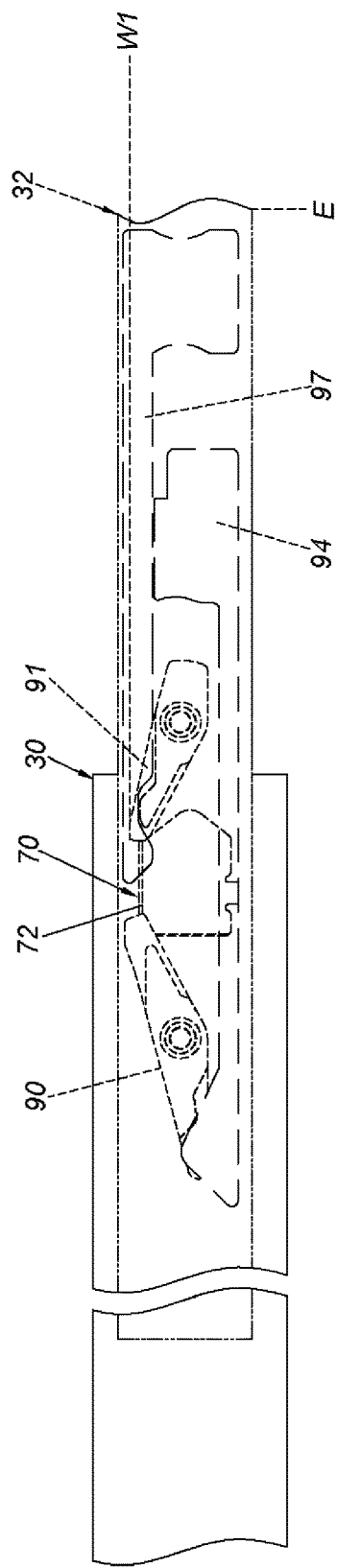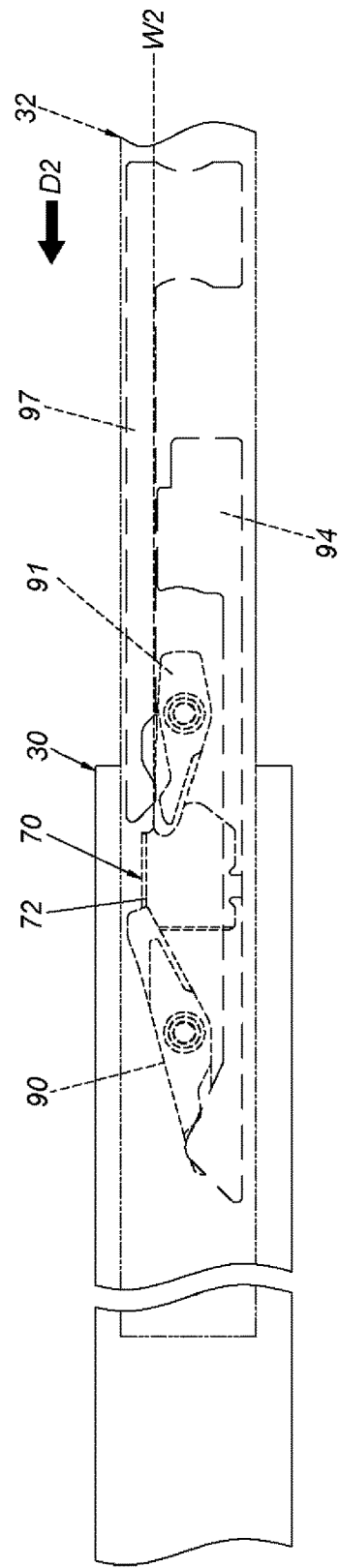

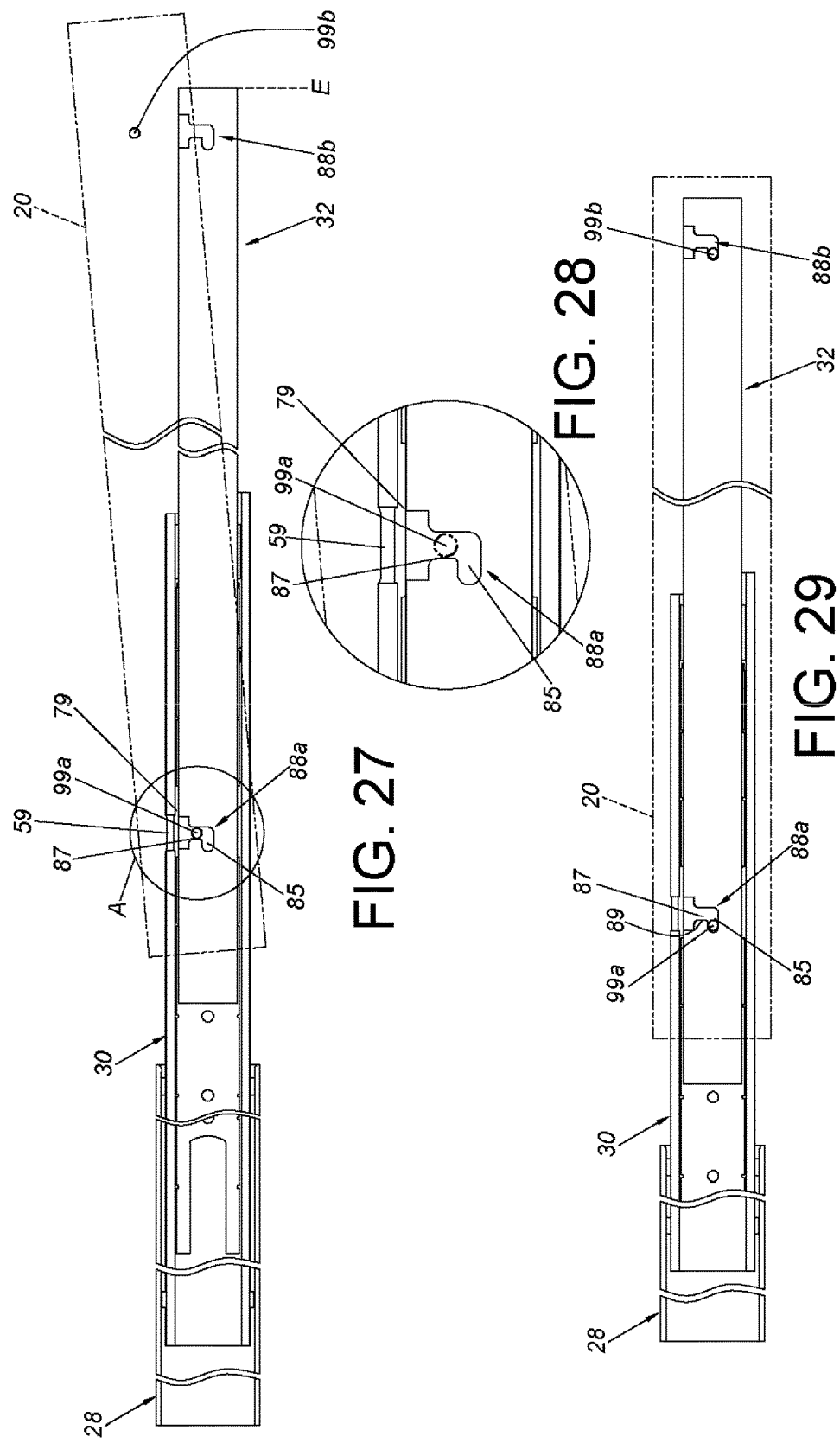

SLIDE RAIL ASSEMBLY

BACKGROUND OF THE INVENTION

1. Field of the Invention

The present invention relates to a slide rail assembly, and more particularly, to a slide rail assembly capable of mounting a carried object.

2. Description of the Prior Art

A three-section slide rail assembly comprises a first rail, a second rail and a third rail. Wherein, the second rail is configured to extend a traveling distance of the third rail relative to the first rail, and the third rail is usually configured to mount a carried object.

When the third rail carries the carried object to move along a direction relative to the second rail and the first rail, strength of the third rail for carrying the carried object may not be enough due to the carried object being overweight, so as to deform or damage the third rail during long term use.

On the other hand, U.S. Pat. No. 6,938,967 B2 of Dubon et al. discloses a drop-in mounting method for mounting a carried object (such as a chassis) to a slide rail assembly. According to the mounting method, the slide rail assembly needs to be completely pulled out of a rack, and then the chassis is lifted to be higher than the slide rail assembly. Thereafter, a plurality of mounting posts at both sides of the chassis are respectively aligned to a plurality of mounting features of the slide rail assembly to be further dropped therein, so as to mount the chassis to the slide rail assembly. The aforementioned mounting method is usually used to mount the chassis in a limited space, and rails of the slide rail assembly are not detachable from each other. However, the aforementioned mounting method has some drawbacks. For example, when the slide rail assembly is located near a top position of the rack, it is inconvenient to lift the chassis to be higher than the slide rail assembly during a process of mounting the chassis to the slide rail assembly.

U.S. Pat. No. 8,622,492 B2 of Chen et al. discloses another method for mounting a carried object (such as a chassis) to a slide rail assembly. According to the mounting method, a rail (such as an inner rail) of the slide rail assembly is required to be pulled out and detached from the slide rail assembly, in order to mount the inner rail to a side of the chassis. Thereafter, the chassis is mounted to the slide rail assembly by inserting the inner rail into the slide rail assembly. Such mounting method requires a larger space than the mounting method of the previous patent does, and is not applicable to a smaller room. An advantage of Chen's mounting method is that when the slide rail assembly is located near the top position of the rack, the chassis can be mounted to the slide rail assembly by aligning and inserting the inner rail to the slide rail assembly without lifting the chassis to be higher than the slide rail assembly.

Each of the two mounting methods has its drawback. The present invention combines the advantages of both mounting methods to provide more product options in the industry.

SUMMARY OF THE INVENTION

The present invention relates to a slide rail assembly configured to mount a carried object.

According to an embodiment of the present invention, a slide rail assembly comprises a first rail, a second rail, a third rail and an engaging member. The first rail comprises a releasing feature. The second rail is movable relative to the first rail. The third rail is movable relative to the second rail. The engaging member is pivoted to the second rail. Wherein, the engaging member is configured to engage with the third rail to allow the second rail and the third rail to be synchronously moved relative to the first rail along a first direction, and the releasing feature is configured to disengage the engaging member from the third rail when the second rail is synchronously moved with the third rail relative to the first rail to a predetermined position.

According to another embodiment of the present invention, a slide rail assembly comprises a middle rail, an inner rail and a first operating rod. The inner rail is movable relative to the middle rail. The inner rail comprises a first wall, a second wall and a side wall connected between the first wall and the second wall. At least one of the first wall and the second wall of the inner rail is arranged with a groove. The first operating rod has one side partially located in the groove of the inner rail.

According to another embodiment of the present invention, a slide rail assembly is configured to mount a chassis. The slide rail assembly comprises a first rail, a second rail and a third rail. The second rail is movable relative to the first rail. The second rail has a first aperture. The third rail is detachably connected to the second rail. The third rail has a plurality of mounting holes and each of the mounting holes has a vertical hole part. Wherein, when the third rail is located at an extension position relative to the second rail, the first aperture of the second rail and the vertical hole parts of the plurality of mounting holes of the third rail are configured to mount the chassis.

According to another embodiment of the present invention, a slide rail assembly comprises a first rail, a second rail, a third rail and a sliding auxiliary device. The second rail is movable relative to the first rail. The second rail has a first aperture. The third rail is movable relative to the second rail. The third rail has a plurality of mounting holes. The sliding auxiliary device is arranged between the second rail and the third rail. The sliding auxiliary device has a second aperture. Wherein, when the third rail is located at an extension position relative to the second rail, the first aperture, the second aperture and one of the mounting holes of the third rail are communicated with each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is an exploded view of the slide rail assembly comprising a first rail, a second rail and a third rail according to an embodiment of the present invention.

FIG. 3 is an enlarged view of an area A of FIG. 2.

FIG. 4 is an enlarged view of an area B of FIG. 2.

FIG. 5 is an enlarged view of an area C of FIG. 2.

FIG. 6 is a diagram showing the third rail of the slide rail assembly according to an embodiment of the present invention.

FIG. 6A is an enlarged view of an area A of FIG. 6.

FIG. 6B is an enlarged view of an area B of FIG. 6.

FIG. 7 is a cross-sectional view of the third rail of the slide rail assembly according to an embodiment of the present invention.

FIG. 8 is a diagram showing the slide rail assembly in a retracted state according to an embodiment of the present invention.

FIG. 9 is a diagram showing the second rail and the third rail of the slide rail assembly being synchronously moved relative to the first rail along a first direction according to an embodiment of the present invention.

FIG. 10 is a diagram showing an engaging member of the slide rail assembly being moved along a releasing feature according to an embodiment of the present invention.

FIG. 11 is an enlarged view of an area A of FIG. 10.

FIG. 12 is a diagram showing the second rail of the slide rail assembly being no longer synchronously moved with the third rail according to an embodiment of the present invention.

FIG. 13 is an enlarged view of an area A of FIG. 12.

FIG. 14 is a diagram showing the engaging member of the slide rail assembly being blocked by the releasing feature in a state according to an embodiment of the present invention.

FIG. 15 is an enlarged view of an area A of FIG. 14.

FIG. 20 is a diagram showing the third rail of the slide rail assembly being moved relative to the second rail along the first direction to drive a sliding auxiliary device to move according to an embodiment of the present invention.

FIG. 21 is a diagram showing the third rail of the slide rail assembly being moved relative to the second rail along the first direction to drive the sliding auxiliary device to move according to an embodiment of the present invention.

FIG. 22 is a diagram showing a blocking feature configured to block a first operating piece when the third rail of the slide rail assembly is moved relative to the second rail along the first direction to a position according to an embodiment of the present invention.

FIG. 23 is a diagram showing the first operating piece being no longer blocked by the blocking feature according to an embodiment of the present invention.

FIG. 24 is a diagram showing the third rail of the slide rail assembly being detached from the second rail according to an embodiment of the present invention.

FIG. 25 is a diagram showing the blocking feature configured to block a second operating piece when the third rail of the slide rail assembly is moved to the position according to an embodiment of the present invention.

FIG. 26 is a diagram showing the second operating piece of the slide rail assembly being no longer blocked by the blocking feature according to an embodiment of the present invention.

FIG. 27 is a diagram showing the slide rail assembly in an extended state and the third rail configured to mount a carried object according to an embodiment of the present invention.

FIG. 28 is an enlarged view of an area A of FIG. 27.

FIG. 29 is a diagram showing the carried being mounted to the third rail of the slide rail assembly according to an embodiment of the present invention.

DETAILED DESCRIPTION

Figure 1:
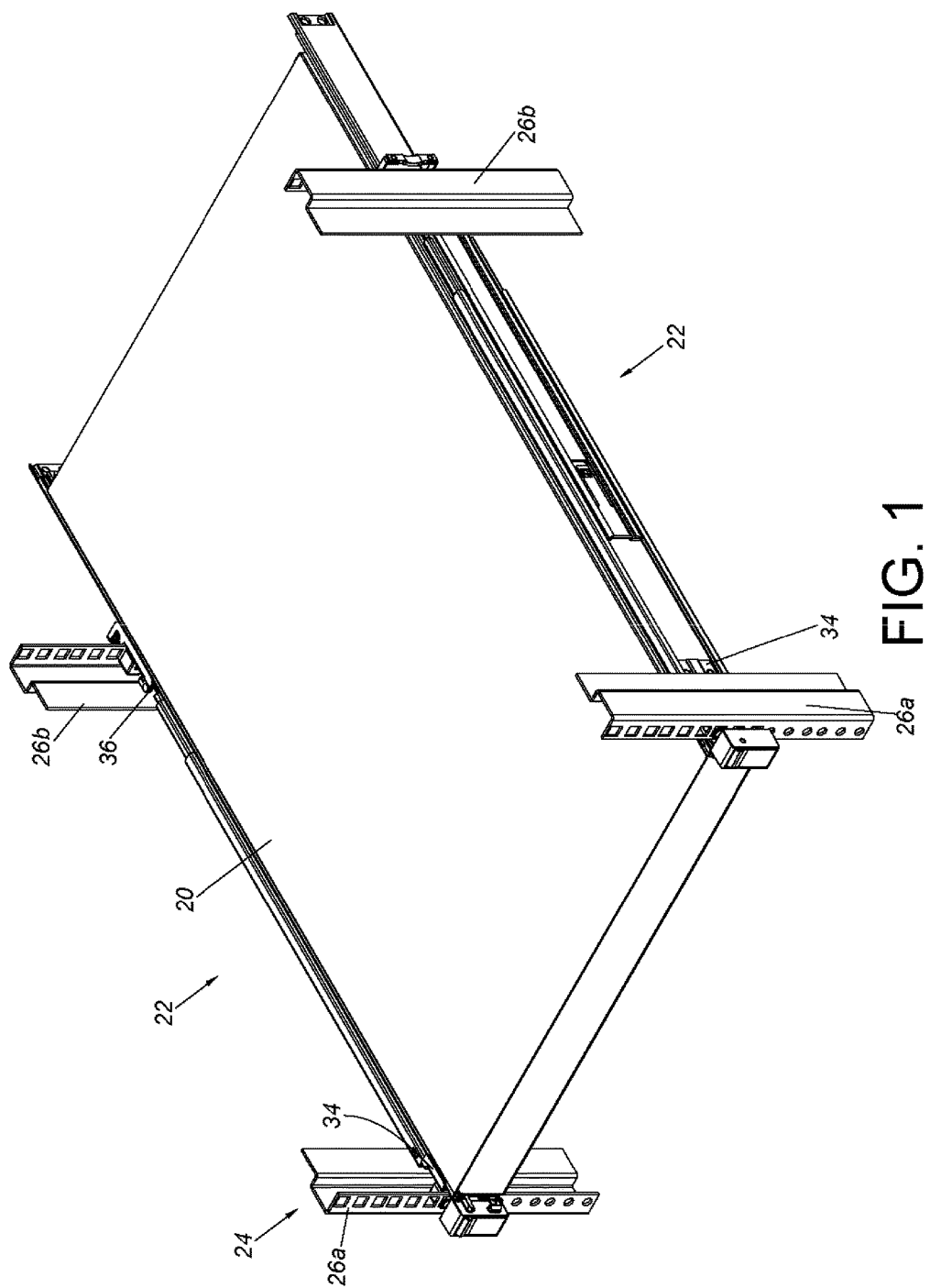
FIG. 1 is a diagram showing slide rail assemblies configured to mount a carried object to a rack according to an embodiment of the present invention.

As shown in FIG. 1, a carried object 20 is mounted to a rack 24 through a pair of slide rail assemblies 22. The carried object 20 can be an electronic apparatus or a chassis. The rack 24 comprises a pair of first post 26a and a pair of second post 26b. Wherein, two portions of each of the slide rail assemblies 22 are respectively mounted to the first post 26a and the second post 26b through a first bracket device 34 and a second bracket device 36. Such arrangement is well known to those skilled in the art. For simplification, no further illustration is provided.

As shown in FIG. 2, the slide rail assembly 22 comprises a first rail 28, a second rail 30 and a third rail 32. The first rail 28 is arranged with the first bracket device 34 and the second bracket device 36. The first rail 28 comprises a releasing feature 38. The releasing feature 38 can be an additional component mounted to the first rail 28; or the releasing feature 38 can be integrally formed on the first rail 28. Furthermore, the first rail 28 comprises a first wall 40a, a second wall 40b, and a side wall 42 connected between the first wall 40a and the second wall 40b. A first passage 43 is defined by the first wall 40a, the second wall 40b and the side wall 42 of the first rail 28.

In the present embodiment, the releasing feature 38 is arranged on the side wall 42 of the first rail 28. Preferably, as shown in FIG. 3, the releasing feature 38 comprises a first guiding part 44, a second guiding part 46, a linear part 48 and a blocking part 50. The blocking part 50 and the linear part 48 are located between the first guiding part 44 and the second guiding part 46. Preferably, each of the first guiding part 44 and the second guiding part 46 has an inclined face or an arc face. The blocking part 50 has a wall located between the first guiding part 44 and the linear part 48. Wherein, the blocking part 50 is recessed relative to the linear part 48.

The second rail 30 (or called as middle rail) is movably mounted to the first rail 28 inside the first passage 43. In particular, the second rail 30 has a first wall 52a, a second wall 52b, and a side wall 54 connected between the first wall 52a and the second wall 52b. A second passage 55 is defined by the first wall 52a, the second wall 52b and the side wall 54 of the second rail 30. Preferably, the side wall 54 of the second rail 30 has a through hole 56 facing toward the side wall 42 of the first rail 28. The second rail 30 has a supporting wall 57 adjacent to the through hole 56. In addition, the second rail 30 has a first aperture 59. In the present embodiment, the first aperture 59 is arranged on the first wall 52a. Furthermore, the slide rail assembly 22 comprises an engaging member 58 movably mounted to the second rail 30. In the present embodiment, the engaging member 58 is pivoted to the side wall 54 of the second rail 30 by a pivoting member 60, and the engaging member 58 is adjacent to a rear end 61 of the second rail 30. The slide rail assembly 22 further comprises an elastic member 62 configured to provide an elastic force to the engaging member 58. For example, the elastic member 62 is mounted between the supporting wall 57 and the engaging member 58. As shown in FIG. 4, the engaging member 58 comprises an engaging part 64. Preferably, the engaging member 58 further comprises an extension part 66 and a disengaging part 68. Wherein, the extension part 66 is located at a position corresponding to the through hole 56 of the second rail 30. The disengaging part 68 has an inclined face or an arc face. Preferably, the second rail 30 comprises a blocking feature 70. In the present embodiment, the blocking feature 70 is arranged on the side wall 54 and adjacent to a front end 71 of the second rail 30. The blocking feature 70 can be an additional component mounted to the second rail 30; or the blocking feature 70 can be integrally formed on the second rail 30. Furthermore, as shown in FIG. 5, the blocking feature 70 has a blocking section 72. The blocking section 72 is protruded relative to the side wall 54 of the second rail 30. In the present embodiment, the slide rail assembly 22 further comprises a sliding auxiliary device 74 movably mounted to the second rail 30 inside the second passage 55. The sliding auxiliary device 74 comprises a holding base 76 and a plurality of rolling members 78 arranged on the holding base 76. The plurality of rolling members 78 can be balls or rollers. Preferably, the holding base 76 of the sliding auxiliary device 74 has a second aperture 79. When the sliding auxiliary device 74 is moved to a position, the second aperture 79 is located at a position corresponding to the first aperture 59 of the second rail 30.

The third rail 32 (or called as inner rail) is movably mounted to the second rail 30 inside the second passage 55. In particular, the third rail 32 has a first wall 80a, a second wall 80b, and a side wall 82 connected between the first wall 80a and the second wall 80b. Preferably, the third rail 32 has an opening 84 and at least one rail wall 86 adjacent to the opening 84. In the present embodiment, the opening 84 is arranged on the first wall 80a. In addition, the third rail 32 has a plurality of mounting holes spaced from each other. In the present embodiment, the third rail 32 has a first mounting hole 88a, a second mounting hole 88b and a third mounting hole 88c. The mounting holes 88a, 88b, 88c are configured to mount the carried object 20. Wherein, at least one of the mounting holes 88a, 88b, 88c is substantially L-shaped or J-shaped. In the present embodiment, the mounting holes 88a, 88b, 88c have identical shapes, but the present invention is not limited thereto. Furthermore, the third rail 32 comprises a plurality of extension features 89. Each of the extension features 89 defines a vertical hole part 87 and a longitudinal hole part 85 of the corresponding mounting hole, wherein the vertical hole part 87 is communicated with the longitudinal hole part 85. The extension feature 89 can be a protrusion located between the vertical hole part 87 and the longitudinal hole part 85.

FIG. 6 is a diagram showing one side of the side wall 82 of the third rail 32 (such as an inner side or a side facing toward the second rail 30). Compared with FIG. 2, FIG. 6 shows the first wall 80a, the second wall 80b and the mounting holes 88a, 88b, 88c of the third rail 32 in an upside down state. Furthermore, the slide rail assembly 22 further comprises a first operating piece 90 movably mounted to the third rail 32. The first operating piece 90 can be operated to be in different working states. In the present embodiment, the first operating piece 90 is pivoted to the third rail 32. Preferably, the slide rail assembly 22 further comprises a supporting base 92 mounted to the third rail 32. The supporting base 92 comprises a first elastic part 93a configured to provide an elastic force to one end of the first operating piece 90, so as to hold the first operating piece 90 in a first working state. Preferably, the first operating piece 90 can be operated through a first operating rod 94. The first operating rod 94 comprises a longitudinal rod part arranged substantially along a longitudinal direction of the third rail 32. The first operating rod 94 further comprises an actuating part 95 located at a position corresponding to another end of the first operating piece 90 for driving the first operating piece 90 to be no longer in the first working state. Preferably, as shown in FIG. 6 and FIG. 6A, at least one of the first wall 80a and the second wall 80b of the third rail 32 is arranged with a groove 81. In the present embodiment, both the first wall 80a and the second wall 80b are arranged with the grooves 81 respectively. Each of the grooves 81 is adjacent to the side wall 82, but the present invention is not limited thereto.

As shown in FIG. 6B, the first operating rod 94 has one side 94a partially located in the groove 81 of the first wall 80a of the third rail 32. An inverted L-shaped protrusion part 83 is arranged on the side wall 82 of the third rail 32 and configured to abut against another side 94b of the first operating rod 94 for preventing the first operating rod 94 from excessively tilting away from a plane of the side wall 82 of the third rail 32 due to tolerance or deformation.

As shown in FIG. 6, the slide rail assembly 22 further comprises a second operating piece 91 movably mounted, such as pivoted, to the third rail 32. The supporting base 92 further comprises a second elastic part 93b configured to provide an elastic force to one end of the second operating piece 91, so as to hold the second operating piece 91 in a first working state. Preferably, the slide rail assembly 22 further comprises a second operating rod 97 having a longitudinal rod part arranged substantially along the longitudinal direction of the third rail 32. Wherein, the second operating rod 97 comprises a driving part 77 corresponding to the second operating piece 91 for driving the second operating piece 91 to be no longer in the first working state. The second operating rod 97 has at least one side partially located in the groove 81 of the third rail 32. In the present embodiment, the second operating rod 97 has two sides 97a, 97b partially located in the grooves 81 of the third rail 32. (please also refer to FIG. 7).

As shown in FIG. 8, the extension part 66 of the engaging member 58 penetrates through the through hole 56 of the second rail 30, and the elastic member 62 is arranged between the engaging member 58 and the supporting wall 57 of the second rail 30, so as to hold the engaging member 58 in a first state S1 relative to the second rail 30. Furthermore, when the slide rail assembly 22 is in a retracted state, the second rail 30 is located at a retracted position relative to the first rail 28, and the rear end 61 of the second rail 30 is located at a position corresponding to at least one rear stopper 96 of the first rail 28. On the other hand, the third rail 32 is also located at a retracted position R relative to the second rail 30. Wherein, the engaging member 58 is driven to abut against one of the first wall 80a and the second wall 80b of the third rail 32 by the elastic member 62. For example, the engaging member 58 is driven to abut against the first wall 80a and held in the first state S1 by the elastic member 62, and the elastic member 62 accumulates an elastic force.

As shown in FIG. 9, when the third rail 32 is moved relative to the second rail 30 from the retracted position R to a first predetermined position P1 along a first direction D1, the engaging member 58 is configured to engage with the third rail 32. In particular, when the third rail 32 is located at the first predetermined position P1 relative to the second rail 30, the engaging member 58 is rotated from the first state S1 to a second state S2 in response to the elastic force released by the elastic member 62, such that the engaging part 64 of the engaging member 58 enters the opening 84 of the third rail 32, and the engaging part 64 is located at a position corresponding to the at least one rail wall 86.

As shown in FIG. 10, FIG. 11 and FIG. 12, when the engaging member 58 is engaged with the third rail 32, the second rail 30 is driven by the third rail 32 to synchronously move. That is to say, the second rail 30 and the third rail 32 can be synchronously moved relative to the first rail 28 along the first direction D1. When the second rail 30 is synchronously moved with the third rail 32 to a second predetermined position P2, the releasing feature 38 of the first rail 28 is configured to disengage the engaging member 58 from the third rail 32. In particular, in a process of the second rail 30 being synchronously moved with the third rail 32, the extension part 66 of the engaging member 58 is moved along the second guiding part 46, the linear part 48, the blocking part 50 and the first guiding part 44 of the releasing feature 38. In particular, when the extension part 66 of the engaging member 58 sequentially passes through the second guiding part 46, the linear part 48 and the blocking part 50 until the second rail 30 is moved relative to the first rail 28 to the second predetermined position P2, the engaging member 58 is guided by the first guiding part 44 through the extension part 66 to be no longer in the second state S2. For example, the engaging member 58 is moved back to the first state S1 from the second state S2 (please also refer to FIG. 13), such that the engaging part 64 of the engaging member 58 is disengaged from the opening 84 of the third rail 32. After the engaging member 58 is disengaged from the third rail 32, the third rail 32 is able to be moved relative to the second rail 30 along the first direction D1 to an extension position E.

As shown in FIG. 12 and FIG. 14, when the second rail 30 is moved relative to the first rail 28 from the second predetermined position P2 to a third predetermined position P3 along a second direction D2 (opposite to the first direction D1), the extension part 66 of the engaging member 58 is blocked by the blocking part 50 of the releasing feature 38 (please also refer to FIG. 15) for preventing the second rail 30 from being moved relative to the first rail 28 along the second direction D2.

Figure 16:
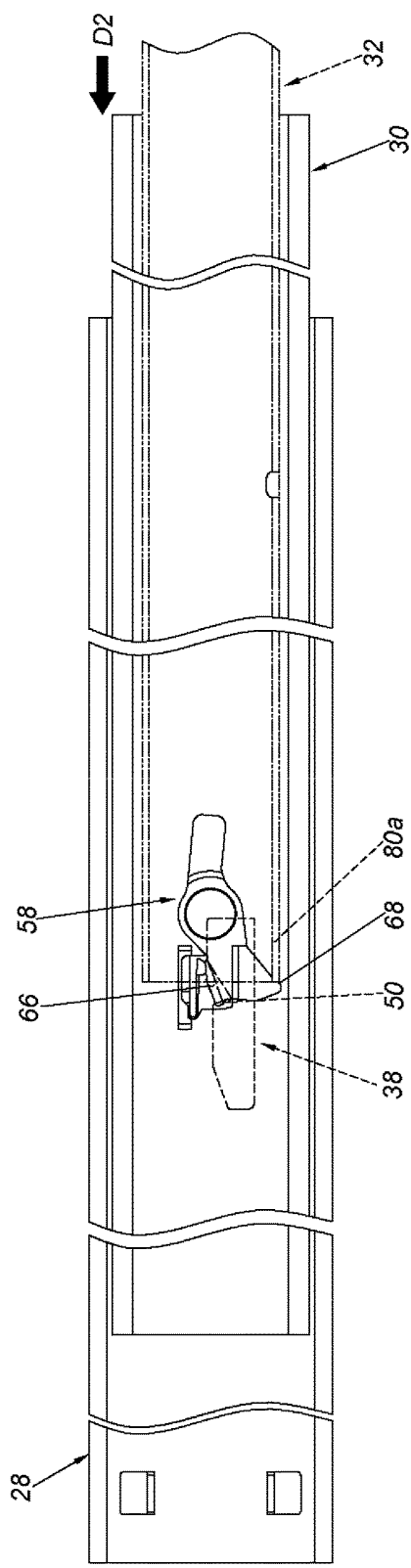
FIG. 16 is a diagram showing the third rail of the slide rail assembly being moved relative to the second rail along a second direction and contacting the engaging member according to an embodiment of the present invention.
Figure 17:
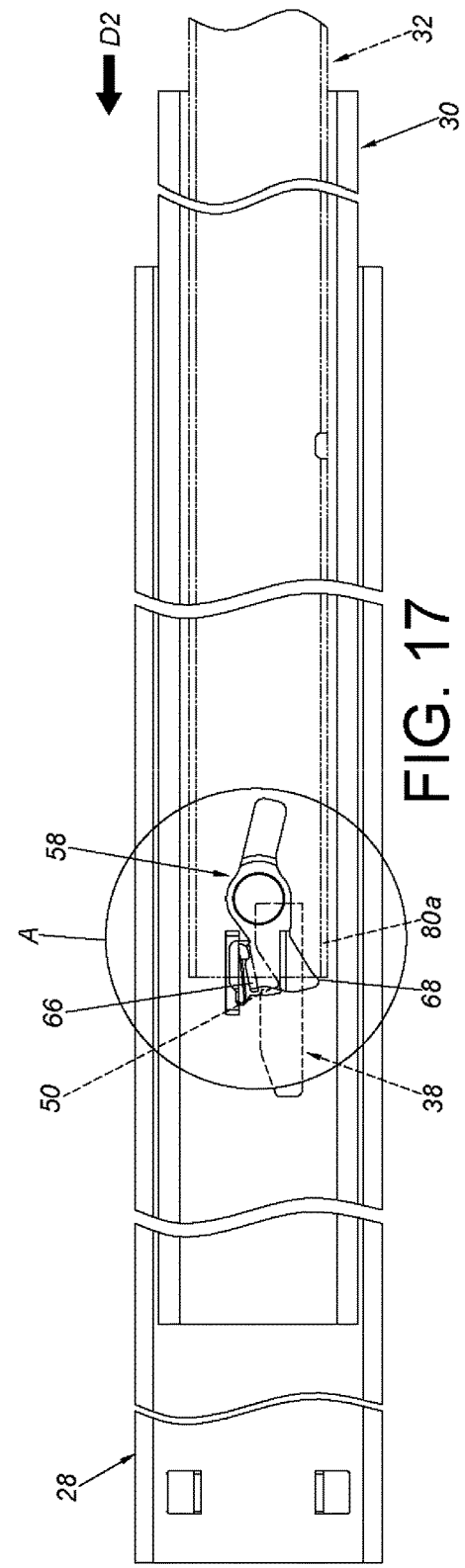
FIG. 17 is a diagram showing the third rail of the slide rail assembly configured to drive the engaging member to be no longer blocked by the releasing member according to an embodiment of the present invention.
Figure 18:
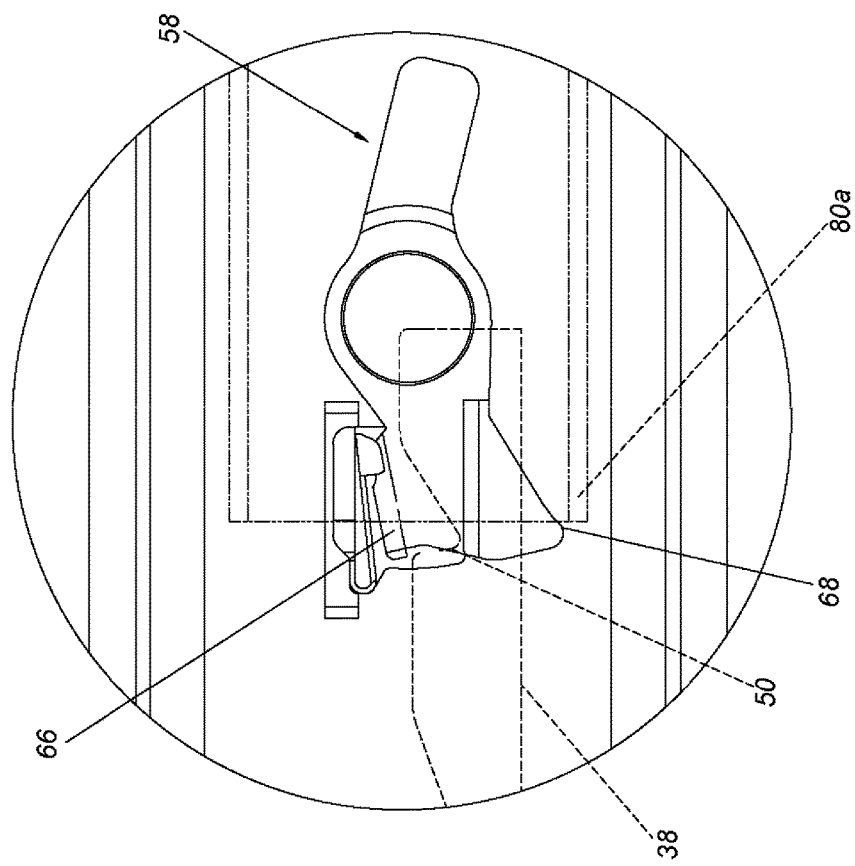
FIG. 18 is an enlarged view of an area A of FIG. 17.

As shown in FIG. 16 and FIG. 17, when the extension part 66 of the engaging member 58 is blocked by the blocking part 50 of the releasing feature 38, and the third rail 32 is moved relative to the second rail 30 from the extension position E along the second direction D2, the third rail 32 is configured to drive the engaging member 58 for moving the extension part 66 of the engaging member 58 to be no longer blocked by the blocking part 50 of the releasing feature 38. In the present embodiment, the first wall 80a of the third rail 32 is configured to drive the engaging member 58 to rotate through the disengaging part 68, in order to detach the extension part 66 from the blocking part 50 of the releasing feature 38 (please also refer to FIG. 18), so as to allow the second rail 30 to be movable relative to the first rail 28 along the second direction D2.

Figure 19:
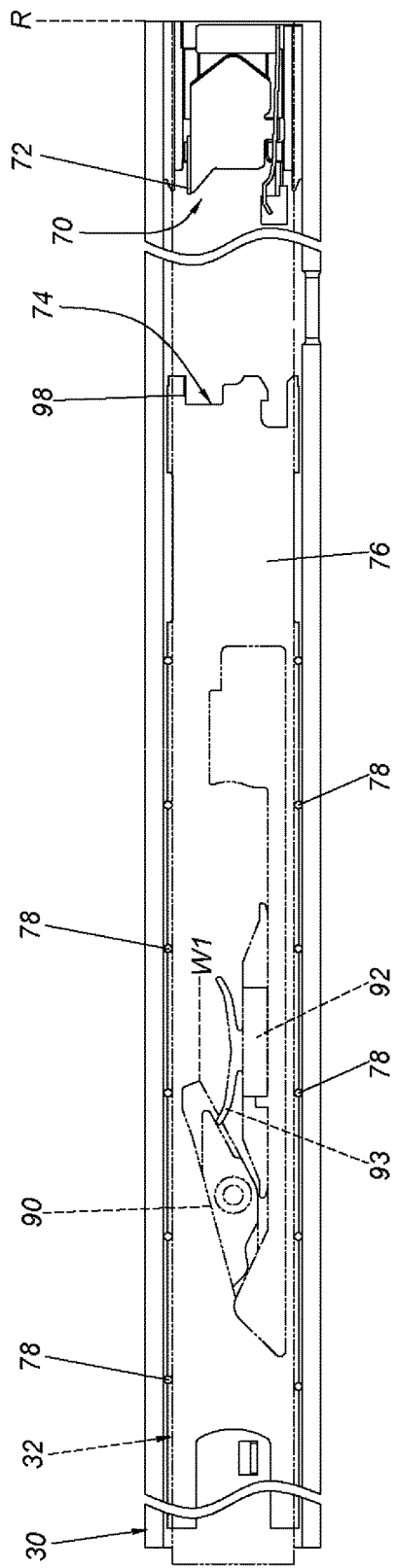
FIG. 19 is a diagram showing the third rail of the slide rail assembly in the retracted state relative to the second rail according to an embodiment of the present invention.

As shown in FIG. 19, the sliding auxiliary device 74 is arranged between the second rail 30 and the third rail 32 for improving smoothness of movement of the third rail 32 relative to the second rail 30. Wherein, the plurality of rolling members 78 on the holding base 76 are in rolling contact with the second rail 30 and the third rail 32. In addition, the holding base 76 comprises a contact part 98. Wherein, the contact part 98 and the blocking section 72 of the blocking feature 70 of the second rail 30 are not aligned along a longitudinal direction of the second rail. On the other hand, the first operating piece 90 corresponds to the contact part 98 of the holding base 76 when being in the first working state W1.

As shown in FIG. 20, when the engaging member 58 is disengaged from the third rail 32 to end the synchronous movement of the second rail 30 and the third rail 32 (please also refer to FIG. 12), the third rail 32 can be further moved relative to the second rail 30 along the first direction D1 (the first rail 28, the second operating piece 91 and the second operating rod 97 are omitted in the figure). When the third rail 32 is moved to a fourth predetermined position P4, the first operating piece 90 abuts against the contact part 98 of the holding base 76 in the first working state W1, in order to force the sliding auxiliary device 74 to synchronously move with the third rail 32 along the first direction D1 (please also refer to FIG. 21); or, the sliding auxiliary device 74 can be moved with the third rail 32 asynchronously along the first direction D1. The way of movement of the sliding auxiliary device 74 along the first direction D1 is not limited thereto. In addition, as shown in FIG. 21, the first wall 80a and the second wall 80b of the third rail 32 respectively contact the plurality of rolling members 78 of the holding base 76.

As shown in FIG. 22, when the third rail 32 is moved relative to the second rail 30 along the first direction D1 to the extension position E, the sliding auxiliary device 74 is driven by the first operating piece 90 to move to a position adjacent to the blocking feature 70 of the second rail 30. The first operating piece 90 abuts against a first side of the blocking section 72 of the blocking feature 70, such that the third rail 32 cannot be further moved relative to the second rail 30 along the first direction D1.

As shown in FIG. 23 and FIG. 24, in order to detach the third rail 32 from the second rail 30, a user can apply a force F along the first direction D1 to the first operating rod 94 for operating the first operating piece 90 to switch from the first working state W1 to a second working state W2. As such, the first operating piece 90 is no longer blocked by the blocking section 72 of the blocking feature 70. Therefore, the third rail 32 can be detached from the second rail 30 along the first direction D1. That is to say, the third rail 32 is detachably connected to the second rail 30.

As shown in FIG. 25, in the present embodiment, when the third rail 32 is moved relative to the second rail 30 to the extension position E (the first rail 28 and the supporting base 92 are omitted in FIG. 25), the second operating piece 91 is in the first working state W1 and located at a second side of the blocking section 72 of the blocking feature 70. In such state, the third rail 32 is not movable relative to the second rail 30 along the second direction D2.

As shown in FIG. 26, in order to move the third rail 32 relative to the second rail 30 along the second direction D2 when the third rail 32 is located at the extension position E, the user can operate the second operating piece 91 through the second operating rod 97 to switch the second operating piece 91 from the first working state W1 to a second working state W2. As such, the second operating piece 91 is no longer located at the second side of the blocking section 72 of the blocking feature 70. Therefore the third rail 32 can be retracted relative to the second rail 30 from the extension position E along the second direction D2.

As shown in FIG. 27, the carried object 20 comprises a plurality of mounting parts, such as a first mounting part 99a and a second mounting part 99b. The plurality of mounting parts 99a, 99b can be mounted to the corresponding mounting holes 88a, 88b of the third rail 32. Furthermore, the slide rail assembly 22 of the present invention is configured to mount the carried object 20 in at least two different mounting ways.

In a first mounting way, when the second rail 30 and the third rail 32 are moved relative to the first rail 28 along the first direction D1, and the third rail 32 is located at the extension position E relative to the second rail 30, the first aperture 59, the second aperture 79 and one of the mounting holes of the third rail 32 (such as the first mounting hole 88a) are located at positions corresponding to each other, or communicated with each other (please also refer to FIG. 28). Therefore, the user can take the carried object 20 to allow the first mounting part 99a of the carried object 20 to enter the longitudinal hole part 85 from the vertical hole part 87 of the first mounting hole 88a (please also refer to FIG. 29). Thereafter, the other mounting part, such as the second mounting part 99b, is mounted to the second mounting hole 88b. Thus, the first aperture 59 of the second rail 30 and the vertical hole parts 87 of the plurality of mounting holes 88a, 88b are configured to mount the carried object 20 (such as the chassis).

Figure 30:
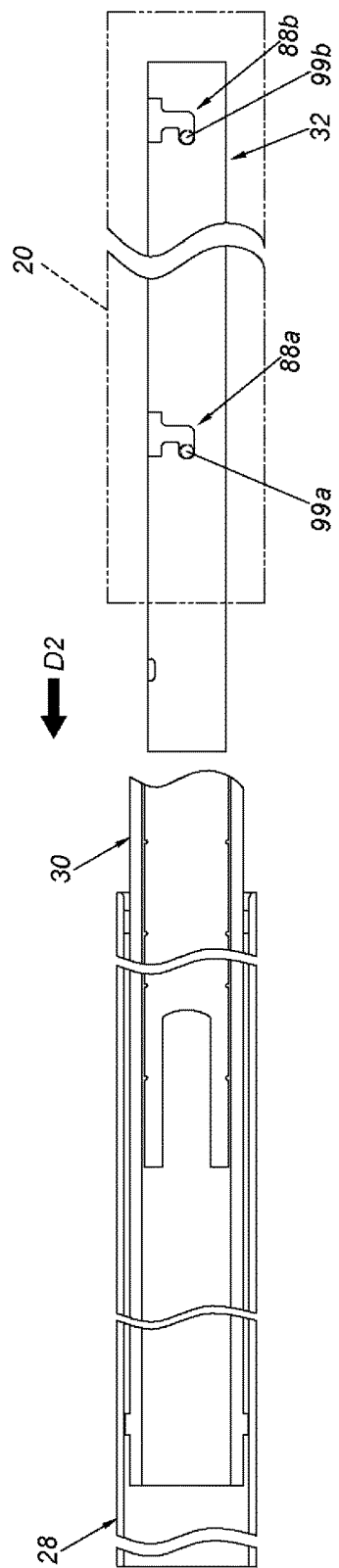
FIG. 30 is a diagram showing the carried object being mounted to the third rail with the third rail being going to be mounted to the second rail according to an embodiment of the present invention.

As shown in FIG. 30, in a second mounting way, after the third rail 32 is detached from the second rail 30, the user can take the carried object 20 to correspondingly mount the mounting parts 99a, 99b to the mounting holes 88a, 88b of the third rail 32. Thereafter, the carried object 20 can be mounted to the slide rail assembly 22 by mounting the third rail 32 to the second rail 30 along the second direction D2.

Therefore, the slide rail assembly 22 of the present invention is characterized in that:

1. When the third rail 32 is located at the extension position E relative to the second rail 30, the mounting hole 88 of the third rail 32 (such as a L-shaped or J-shaped hole), the first aperture 59 of the second rail 30, and the second aperture 79 of the sliding auxiliary device 74 are communicated with each other, such that the carried object 20 can be mounted to the slide rail assembly 22 without detaching the third rail 32 from the second rail 30; or, the third rail 32 can be detached from the second rail 30 to mount the carried object 20 to the third rail 32 first, and the third rail 32 is mounted to the second rail 30 thereafter. Therefore, the slide rail assembly 22 is configured to mount the carried object 20 in at least two different mounting ways, so as to allow the user to mount or detach the carried object 20 conveniently according to different requirements in a limited space.

2. Through engaging the engaging member 58 with the third rail 32, the second rail 30 and the third rail 32 can be synchronously moved along the first direction D1. After the extension part 66 of the engaging member 58 passes through the blocking part 50 of the releasing feature 38, the first guiding part 44 of the releasing feature 38 is configured to end the synchronous movement of the second rail 30 and the third rail 32.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A slide rail assembly, comprising:
a first rail comprising a releasing feature;
a second rail movable relative to the first rail;
a third rail movable relative to the second rail, the third rail comprising a first wall, a second wall and a side wall connected between the first wall and the second wall, at least one of the first wall and the second wall of the third rail being arranged with a cut-out portion defining a groove, the groove being concaved from a surface of the at least one of the first wall and the second wall of the third rail; and
an engaging member pivoted to the second rail;
wherein the engaging member is configured to engage with the third rail to allow the second rail and the third rail to be synchronously moved relative to the first rail along a first direction, and the releasing feature is configured to disengage the engaging member from the third rail when the second rail is synchronously moved with the third rail relative to the first rail to a predetermined position.

2. The slide rail assembly of claim 1, wherein:
when the third rail is moved relative to the second rail along the first direction from a retracted position to a first predetermined position, the engaging member is configured to engage with the third rail to allow the second rail and the third rail to be synchronously moved relative to the first rail along the first direction;
when the second rail is synchronously moved with the third rail relative to the first rail along the first direction to a second predetermined position, the releasing feature is configured to disengage the engaging member from the third rail to allow the third rail to be moved relative to the second rail along the first direction to an extension position.

3. The slide rail assembly of claim 2, wherein the slide rail assembly further comprises an elastic member configured to provide an elastic force to the engaging member, the third rail comprises a first wall, a second wall and a side wall connected between the first wall and the second wall, and when the third rail is located at the retracted position relative to the second rail, the engaging member abuts against the first wall to be held in a first state in response to the elastic force of the elastic member.

4. The slide rail assembly of claim 3, wherein the third rail has an opening and a rail wall adjacent to the opening, the engaging member comprises an engaging part, and when the third rail is located at the first predetermined position relative to the second rail, the engaging member is rotated relative to the second rail from the first state to a second state in response to the elastic force of the elastic member, such that the engaging part enters the opening to correspond to the rail wall.

5. The slide rail assembly of claim 2, wherein the second rail has a through hole facing toward the first rail, the engaging member comprises an extension part passing through the through hole, the releasing feature comprises a first guiding part, when the second rail is synchronously moved with the third rail along the first direction to the second predetermined position, the engaging member is guided by the first guiding part through the extension part to be no longer in the second state, so as to allow the engaging member to be disengaged from the third rail, the first guiding part has an inclined face or an arc face.

6. The slide rail assembly of claim 5, wherein the releasing feature further comprises a blocking part, when the second rail is moved relative to the first rail from the second predetermined position to a third predetermined position along a second direction opposite to the first direction, the extension part of the engaging member is blocked by the blocking part for preventing the second rail from being moved relative to the first rail along the second direction.

7. The slide rail assembly of claim 6, wherein during a process of the third rail being moved relative to the second rail along the second direction from the extension position, the third rail is configured to drive the engaging member for moving the extension part of the engaging member to be no longer blocked by the blocking part.

8. The slide rail assembly of claim 6, wherein the releasing feature further comprises a second guiding part and a linear part, the blocking part and the linear part are located between the first guiding part and the second guiding part, wherein the blocking part has a wall located between the first guiding part and the linear part, the second guiding part has an inclined face or an arc face.

9. The slide rail assembly of claim 1, wherein the third rail has a plurality of mounting holes spaced from each other, and the third rail comprises an extension feature for defining a vertical hole part and a longitudinal hole part of the mounting hole, the longitudinal hole part is communicated with the vertical hole part.

10. The slide rail assembly of claim 1, further comprising a sliding auxiliary device arranged between the second rail and the third rail, the sliding auxiliary device comprises a holding base and a plurality of rolling members arranged on the holding base, the plurality of rolling members are in rolling contact with the second rail and the third rail.

11. The slide rail assembly of claim 10, further comprising a first operating piece mounted to the third rail, wherein the first operating piece is configured to be operatively switched between a first working state and a second working state, the second rail comprises a blocking feature having a blocking section, when the engaging member is disengaged from the third rail by the releasing feature, and the third rail is moved relative to the second rail along the first direction to an extension position, the first operating piece is configured to abut against one side of the blocking section of the blocking feature in the first working state.

12. The slide rail assembly of claim 11, wherein the second rail has a first aperture and the sliding auxiliary device has a second aperture, when the third rail is located at the extension position, the first aperture, the second aperture and one of the mounting holes of the third rail are communicated with each other, and when the first operating piece is operatively switched from the first working state to the second working state, the third rail is detachable from the second rail along the first direction.

13. A slide rail assembly, comprising:
a middle rail;
an inner rail movable relative to the middle rail, the inner rail comprising a first wall, a second wall and a side wall connected between the first wall and the second wall, at least one of the first wall and the second wall of the inner rail being arranged with a cut-out portion defining a groove; and
a first operating rod having one side partially located in the groove of the inner rail;
wherein the groove is concaved from a surface of the at least one of the first wall and the second wall of the inner rail, and a width of the groove is substantially equal to a thickness of the one side of the first operating rod.

14. The slide rail assembly of claim 13, wherein the middle rail comprises a blocking feature, the blocking feature has a blocking section, a protrusion part is arranged on the side wall of the inner rail and configured to abut against another side of the first operating rod, the slide rail assembly further comprises a first operating piece mounted to the inner rail, the first operating rod is configured to be operatively switched between a first working state and a second working state, when the inner rail is located at an extension position relative to the middle rail, the first operating piece is configured to abut against one side of the blocking section of the blocking feature in the first working state, and the inner rail is detachable from the middle rail when the first operating piece is in the second working state.

15. The slide rail assembly of claim 13, wherein both the first wall and the second wall of the inner rail are arranged with the grooves respectively, and each of the grooves is adjacent to the side wall, the slide rail assembly further comprises a second operating rod, the second operating rod has a side corresponding to the groove of the first wall and another side corresponding to the groove of the second wall, at least one of the side and the another side of the second operating rod is partially located in the at least one of the groove of the first wall and the groove of the second wall.

16. A slide rail assembly configured to mount a chassis, the slide rail assembly comprising:
a first rail;
a second rail movable relative to the first rail, the second rail has a first aperture; and
a third rail detachably connected to the second rail, the third rail having a plurality of mounting holes, each of the mounting holes having a vertical hole part;
wherein when the third rail is located at an extension position relative to the second rail, the first aperture of the second rail is communicated with one of the vertical hole parts of the plurality of mounting holes of the third rail for mounting the chassis;
wherein when the third rail is detached from the second rail, the third rail is configured to mount the chassis to the second rail through the chassis being mounted to the mounting holes of the third rail.

17. The slide rail assembly of claim 16, wherein the first rail comprises a releasing feature, and the slide rail assembly further comprises an engaging member mounted to the second rail; wherein when the third rail is moved relative to the second rail along a first direction from a retracted position to a first predetermined position, the engaging member is configured to engage with the third rail to allow the second rail and the third rail to be synchronously moved relative to the first rail along the first direction; wherein when the second rail is synchronously moved with the third rail relative to the first rail along the first direction to a second predetermined position, the releasing feature is configured to disengage the engaging member from the third rail to allow the third rail to be moved relative to the second rail along the first direction to the extension position.

18. The slide rail assembly of claim 17, wherein the engaging member is pivoted to the second rail, the slide rail assembly further comprises an elastic member configured to provide an elastic force to the engaging member, the third rail comprises a first wall, a second wall and a side wall connected between the first wall and the second wall, and when the third rail is located at the retracted position relative to the second rail, the engaging member is configured to abut against the first wall to be held in a first state in response to the elastic force of the elastic member.

19. The slide rail assembly of claim 18, wherein the third rail has an opening and a rail wall adjacent to the opening, the engaging member comprises an engaging part, when the third rail is located at the first predetermined position relative to the second rail, the engaging member is rotated relative to the second rail from the first state to a second state in response to the elastic force of the elastic member, such that the engaging part enters the opening to correspond to the rail wall.

20. The slide rail assembly of claim 17, wherein the second rail has a through hole facing toward the first rail, the engaging member comprises an extension part passing through the through hole, the releasing feature comprises a first guiding part, when the second rail is synchronously moved with the third rail along the first direction to the second predetermined position, the engaging member is guided by the first guiding part through the extension part to be disengaged from the third rail, the first guiding part has an inclined face or an arc face.

21. The slide rail assembly of claim 20, wherein the releasing feature further comprises a blocking part, when the second rail is moved relative to the first rail from the second predetermined position to a third predetermined position along a second direction opposite to the first direction, the extension part of the engaging member is blocked by the blocking part for preventing the second rail from being moved relative to the first rail along the second direction.

22. The slide rail assembly of claim 21, wherein during a process of the third rail being moved relative to the second rail along the second direction from the extension position, the third rail is configured to drive the engaging member for moving the extension part of the engaging member to be no longer blocked by the blocking part.

23. The slide rail assembly of claim 21, wherein the releasing feature further comprises a second guiding part and a linear part, the blocking part and the linear part are located between the first guiding part and the second guiding part, wherein the blocking part has a wall located between the first guiding part and the linear part, the second guiding part has an inclined face or an arc face.

24. The slide rail assembly of claim 16, further comprising an operating piece mounted to the third rail, wherein the operating piece is configured to be operatively switched between a first working state or a second working state, the second rail comprises a blocking feature having a blocking section; when the third rail is located at the extension position, the operating piece is configured to abut against one side of the blocking section of the blocking feature in the first working state; when the operating piece is operatively switched from the first working state to the second working state, the third rail is detachable from the second rail along the first direction.

25. A slide rail assembly, comprising:
a first rail;
a second rail movable relative to the first rail, the second rail having a first aperture;
a third rail movable relative to the second rail, the third rail having a plurality of mounting holes; and a sliding auxiliary device arranged between the second rail and the third rail, the sliding auxiliary device having a second aperture;
wherein when the third rail is located at an extension position relative to the second rail, the first aperture, the second aperture and one of the mounting holes of the third rail are communicated with each other one another for enabling a chassis to be mounted to the third rail via the first aperture, the second aperture and the one of the mounting holes;
wherein when the third rail is detached from the second rail, the third rail is configured to mount the chassis to the second rail through the chassis being mounted to the mounting holes of the third rail.

26. A slide rail assembly of claim 25, wherein the first rail comprises a releasing feature, the slide rail assembly further comprises an engaging member pivoted to the second rail, the engaging member is configured to engage with the third rail; wherein when the engaging member engages with the third rail, the second rail and the third rail are configured to be synchronously moved relative to the first rail along a first direction, and when the second rail is moved relative to the first rail to a predetermined position, the releasing feature is configured to disengage the engaging member from the third rail.

27. The slide rail assembly of claim 26, further comprising an elastic member configured to provide an elastic force to the engaging member, wherein the third rail comprises a first wall, a second wall and a side wall connected between the first wall and the second wall, and when the third rail is located at a retracted position relative to the second rail, the engaging member is configured to abut against the first wall to be held in a first state in response to the elastic force of the elastic member.

28. The slide rail assembly of claim 27, wherein the third rail has an opening and a rail wall adjacent to the opening, the engaging member comprises an engaging part, when the third rail is moved relative to the second rail along the first direction from the retracted position to a position, the engaging member is rotated from the first state to a second state in response to the elastic force of the elastic member, such that the engaging part enters the opening to correspond to the rail wall for allowing the engaging member to engage with the third rail.

29. The slide rail assembly of claim 28, wherein the second rail has a through hole facing toward the first rail, the engaging member comprises an extension part passing through the through hole, the releasing feature comprises a first guiding part, when the second rail is synchronously moved with the third rail along the first direction to the predetermined position, the engaging member is guided by the first guiding part through the extension part to be no longer in the second state, so as to allow the engaging member to be disengaged from the third rail.

30. The slide rail assembly of claim 29, wherein the releasing feature further comprises a second guiding part, a linear part and a blocking part, the blocking part and the linear part are located between the first guiding part and the second guiding part, when the second rail is synchronously moved with the third rail along the first direction to the predetermined position, the extension part of the engaging member is moved along the second guiding part, the linear part, the blocking part and the first guiding part, wherein each of the first guiding part and the second guiding part has an inclined face or an arc face, the blocking part has a wall located between the first guiding part and the linear part, the extension part of the engaging member is configured to be blocked by the blocking part for preventing the second rail from being moved relative to the first rail along a second direction opposite to the first direction.

* * * * *